(12) United States Patent
Cheng et al.

(10) Patent No.: US 8,962,423 B2
(45) Date of Patent: Feb. 24, 2015

(54) MULTILAYER MIM CAPACITOR

(75) Inventors: Kangguo Cheng, Schenectady, NY (US); Joseph Ervin, Wappingers Falls, NY (US); Chengwen Pei, Danbury, CT (US); Ravi M. Todi, Poughkeepsie, NY (US); Geng Wang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 579 days.

(21) Appl. No.: 13/352,655

(22) Filed: Jan. 18, 2012

(65) Prior Publication Data

US 2013/0181326 A1   Jul. 18, 2013

(51) Int. Cl.
  *H01L 21/8242* (2006.01)
(52) U.S. Cl.
  USPC .......................................... 438/243; 438/386
(58) Field of Classification Search
  CPC ............... H01L 27/1087; H01L 29/66181; H01L 27/10829
  USPC ....................................................... 257/301
  See application file for complete search history.

(56) References Cited

U.S. PATENT DOCUMENTS

| | | | |
|---|---|---|---|
| 6,693,016 B2 | 2/2004 | Gutsche et al. | |
| 7,250,334 B2 | 7/2007 | Crenshaw et al. | |
| 7,425,740 B2 | 9/2008 | Liu et al. | |
| 7,602,599 B1 | 10/2009 | Hsu | |
| 7,667,292 B2 * | 2/2010 | Giraudin et al. | 257/532 |
| 7,670,921 B2 | 3/2010 | Chinthakindi et al. | |
| 7,829,426 B2 | 11/2010 | Burke et al. | |
| 7,919,385 B2 | 4/2011 | Nakamura | |
| 2006/0141700 A1 | 6/2006 | Nam | |

OTHER PUBLICATIONS

J. H. Klootwijk, et al., "Ultrahigh Capacitance Density for Multiple ALD-Grown MIM Capacitor Stacks in 3-D Silicon", IEEE Electron Device Letters, vol. 29, No. 7, Jul. 2008, pp. 740-742.

F. Roozeboom, et al. "Ultrahigh-density (>0.4 uF/mm2) trench capacitors in Silicon", First Int. Workshop on Power Supply on Chip (PowerSoC08), Sep. 22-24, 2008, Cork, Ireland.

\* cited by examiner

*Primary Examiner* — Jack Chen
(74) *Attorney, Agent, or Firm* — Catherine Ivers

(57) ABSTRACT

An improved semiconductor capacitor and method of fabrication is disclosed. A MIM stack, comprising alternating first-type and second-type metal layers (each separated by dielectric) is formed in a deep cavity. The entire stack can be planarized, and then patterned to expose a first area, and selectively etched to recess all first metal layers within the first area. A second selective etch is performed to recess all second metal layers within a second area. The etched recesses can be backfilled with dielectric. Separate electrodes can be formed; a first electrode formed in said first area and contacting all of said second-type metal layers and none of said first-type metal layers, and a second electrode formed in said second area and contacting all of said first-type metal layers and none of said second-type metal layers.

11 Claims, 10 Drawing Sheets

MULTILAYER MIM CAPACITOR

FIELD OF THE INVENTION

The present invention relates to semiconductor integrated circuits, and more particularly to a semiconductor capacitor, and method for fabricating the same.

BACKGROUND OF THE INVENTION

High Capacity Capacitors have been used in the semiconductor industry for years, in applications such as DRAM storage, protection from high energy environments, decoupling capacitors and many more. As integrated circuits continue to become more densely built, small and powerful decoupling capacitors are needed for optimal system performance.

A promising high-density capacitor for radio-frequency decoupling applications is reported by Klootwijt, et al., Ultrahigh Capacitance Density for Multiple ALD-Grown MIM Capacitor Stacks in 3-D Silicon", IEEE Electron Device Letters, 29:7, July 2008 (hereafter the "Philips MIM capacitor"). Klootwijt et al discloses a method to form the 3-D capacitor 100 illustrated in FIG. 1. According to Klootwijt et al, a macropore 110 of about 1.5 micron diameter and 30 micron depth is formed in a substrate 101 that is "(arsenic) n++-doped silicon." A 5-nm thermally grown SiO2 layer 121 coats the walls of the pore, then a "stack [125] of TiN/Al2O3/TiN/Al2O3/TiN is deposited by ALD" to complete the triple MIM capacitor stack. Conditions are controlled to avoid oxidation of the TiN electrode layers. "On completion, the layers are patterned for contacting the electrodes and covered with a low-temperature interlevel oxide layer. Finally, contact holes are opened, and bond pads 131 to 134 are formed."

The process described by the above reference requires multiple lithography steps. What is needed is a simplified process to form an ultra-high density trench capacitor.

BRIEF DESCRIPTION OF THE DRAWINGS

The structure, operation, and advantages of the present invention will become further apparent upon consideration of the following description taken in conjunction with the accompanying figures. The figures are intended to be illustrative, not limiting.

FIGS. 2, 3A to 5A, and 6 illustrate the formation of a MIM stack in a cavity in accordance with embodiments of the present invention.

FIGS. 3B to 5B are cross section views corresponding to FIGS. 3A to 5A for an embodiment formed in a circular cavity.

SUMMARY

According to an embodiment of the present invention, a layered structure can be formed within a cavity, the layered structure having a plurality of metal layers insulated from each other, where the plurality includes a set of first-type metal layers and a set of second-type metal layers. Adjacent pairs of the plurality of metal layers include a first-type metal layer and a second-type metal layer. The first-type metal layers can be selectively etched relative to the second-type metal layers by a first etch chemistry, and the second-type metal layers can be selectively etched relative to the first-type metal layers by a second etch chemistry. The structure can also include one electrode contacting just the first-type metal layers and another electrode contacting just the second-type metal layers.

Another embodiment of the present invention is a method to form a deep-trench capacitor. The method utilizes a stack of metal layers formed in a cavity, where each adjacent pair of said stack includes a first-type metal layer and a second-type metal layer. The stack also includes an insulating layer between such adjacent pairs. The method includes exposing a cross section of the stack, etching the first-type metal layers within a first area of the cross section while not appreciably etching the second-type metal layers, and etching the second-type metal layers within a second area of the cross section while not appreciably etching the first-type metal layers. The method can further include forming the stack of metal layers within the cavity. The method can further include recessing the first-type metal layers within a first area of the cross section and recessing the second-type metal layers within a second area of the cross section. The method can include backfilling such recesses with dielectric and forming a first electrode in contact with just the second-type metal layers in the first area and forming a second electrode in contact just with the first-type metal layers in the second area.

According to yet another embodiment of the present invention, the structure of claim 4 can be made according the method of claim 12. The method to form the structure of claim 4 can further include the method of claim 18.

DETAILED DESCRIPTION

The complicated lithography required to connect the electrodes of the Philips MIM capacitor restricts that capacitor to just a few layers (e.g., three metal layers). The present inventors have devised a method to form a MIM capacitor ("MIM-CAP") having up to fifteen plates, or any number of plates, constrained only by the thicknesses of the deposited layers and the dimension of the cavity within which the MIMCAP is formed.

Figure 1:
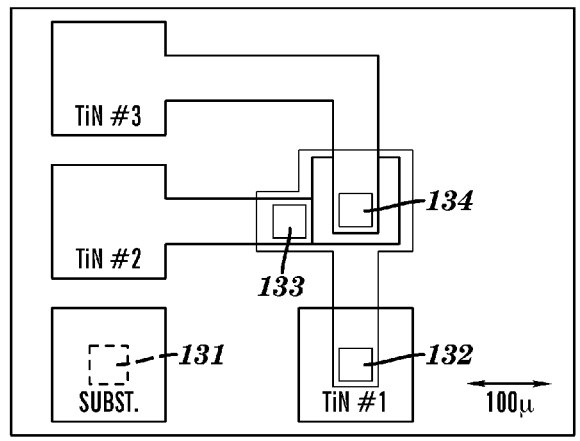
FIG. 1 illustrates a MIM capacitor in accordance with prior art.
Figure 1:
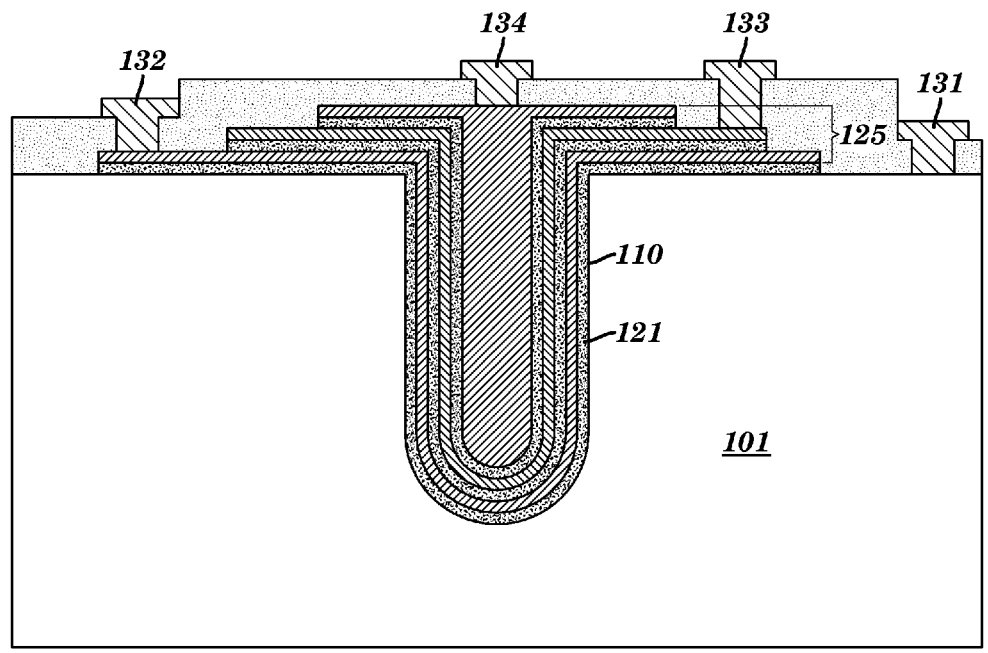
Figure 2:
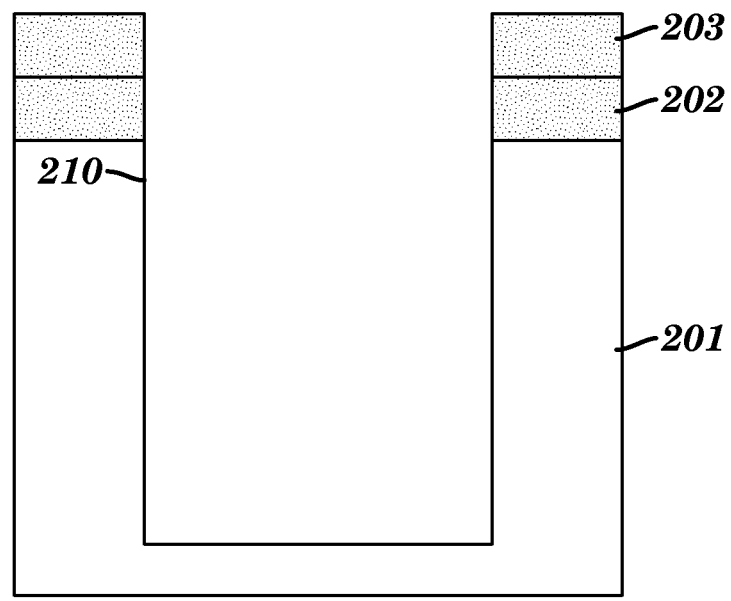

Referring now to FIG. 2, an opening such as cavity 210 is formed in a substrate 201, according to a patterned mask. The mask may be, for example, oxide hardmask 203 on top of pad nitride 202. The substrate may be a semiconductor wafer, which may be, for example, a silicon or gallium nitride substrate, and can be a semiconductor-on-insulator (SOI) substrate. The substrate can be heavily doped to serve as a capacitor plate, for example, silicon with arsenic (As) dopant at 1E19 to 5E21, or the capacitor plates can be formed with the metal layers only and the substrate can be undoped. The invention is not limited to particular dimensions of cavity 210, but it can be about 1.5 micron across and 30 micron depth. The opening of cavity 210 can be the critical dimension (the minimum dimension patternable by the lithography used to form devices (not shown) in or on substrate 201). Cavity 210 can be a trench (formed according to a generally rectilinear pattern with a length and width), a pore (formed according to a circular pattern), an annulus, or an opening formed according to a pattern of any other shape.

Figure 3A:
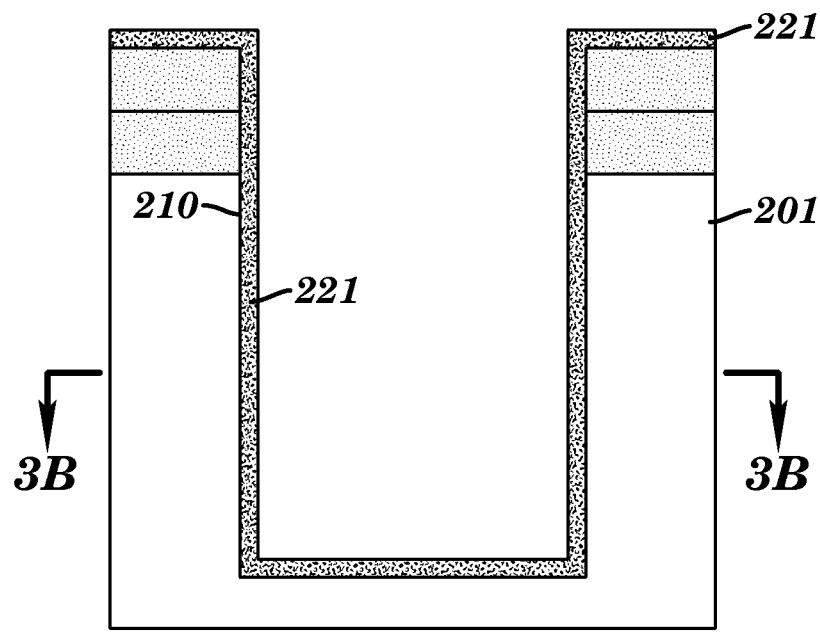
Figure 3B:
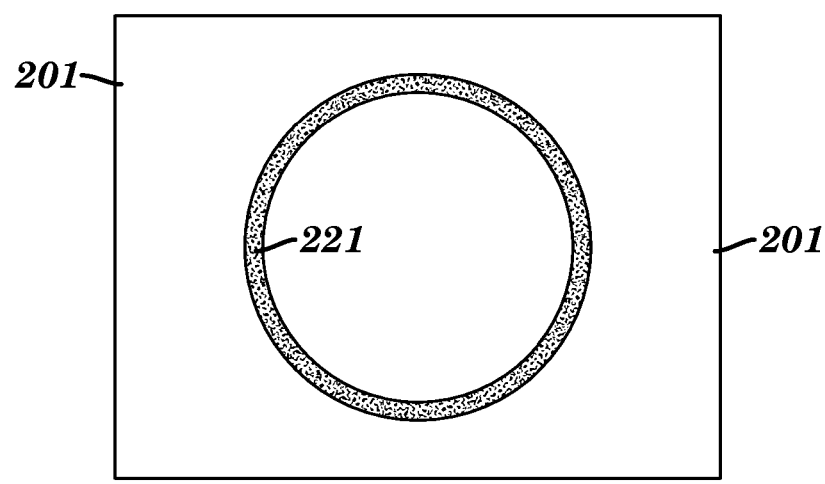

Dielectric layer 221 can be formed over the sidewalls and bottom of cavity 210. As shown in FIG. 3A, dielectric layer 221 can be a conformal layer having substantially uniform thickness on all surfaces. Layer 221 can be thermally grown, or formed by conventional deposition such as plasma-enhanced chemical vapor deposition (PECVD) or atomic layer deposition (ALD). In embodiments, layer 221 is high-K dielectric having dielectric constant greater than 2.5, and can have dielectric constant in the range of 15 to 20, or even greater than 20. Layer 221 can be any interlayer dielectric material (ILD), which can be an high k material such as hafnium oxide (HfO2), hafnium silicate, zirconium oxide, aluminum oxide or zirconium silicate. Layer 221 can also be any other dielectric compound, and can be a combination of dielectric materials. Dielectric layer 221 can range in thickness from about 20 angstroms to about 50 angstroms, and is preferably at least 15 angstrom thick. Conformality of +/−20% is desirable, but can be more relaxed as long as no substantially weak spots exist in the dielectric film which could cause premature breakdown in operation. FIG. 3B illustrates a cross section at cut '3B', if cavity 210 is a pore.

Figure 4A:
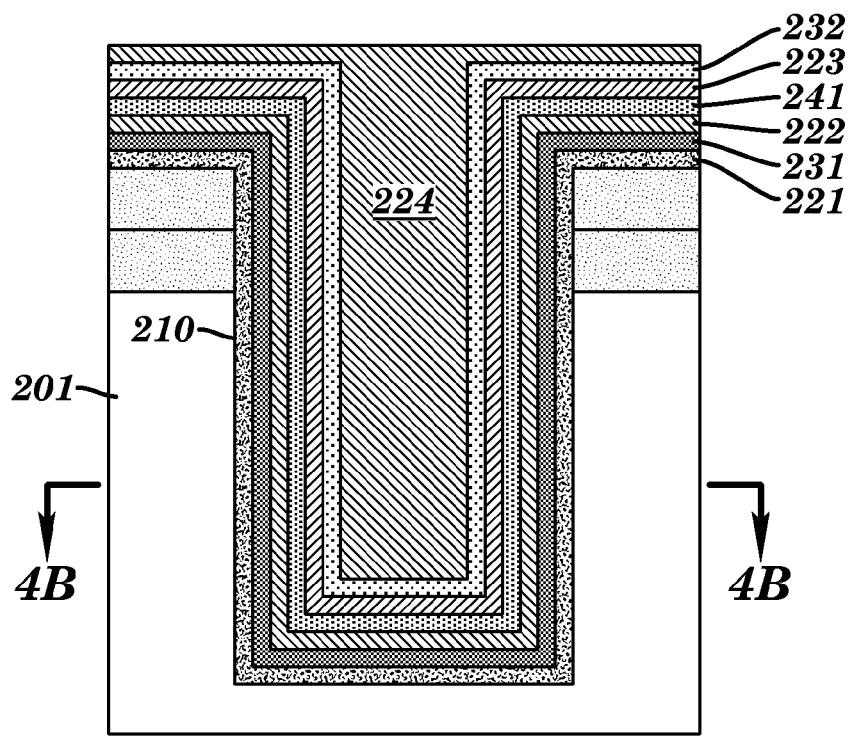

FIG. 4A shows first conductive layer 231 formed over dielectric layer 221. First conductive layer 231 is preferably a conformal layer, which can be a metal layer and can be formed by known processing such as ALD. Second dielectric layer 222 is formed over first metal layer 231. A second conductive layer 241 can be formed over second dielectric layer 222. Like the first conductive layer, the second conductive layer 241 can be formed of metal. Reference throughout the following description to 'metal' refers to any conductive material.

Figure 4B:
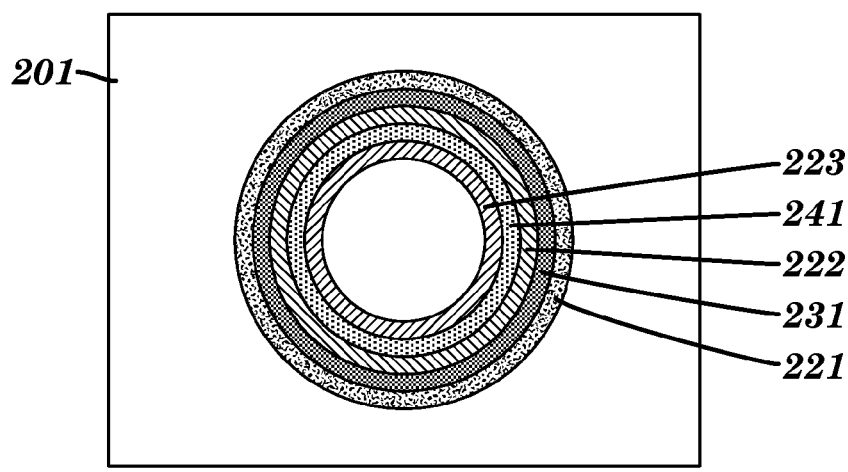

The sequence of dielectric, first metal, dielectric, and second metal can be repeated numerous times. For example, repeating n=four times would produce a structure with n+1=5 first metal layers interleaved with 5 second metal layers, with dielectric separating adjacent metal layers. The stack can be completed, after repeating the first four layers as desired (or not repeating even once), by depositing a final dielectric layer that fills any remaining space within cavity 210. Such a final stack would have an equal number of first and second metal layers. Alternatively, after forming just the first four layers, or after repeating the four-layer sequence 'n' times, the stack can be completed by depositing another dielectric layer (223 in FIG. 4A if n=0), then a final first metal layer (232 if n=0), and finally a final dielectric layer (224 if n=0) that fills any remaining space within cavity 210. The stack in such an embodiment would have 1+n second metal layers and would have 2+n first metal layers. FIG. 4B is a cross section at cut 4B for a pore-type embodiment at an intermediate stage after depositing dielectric 223 onto second metal layer 241.

The thickness of the metal is determined by structural integrity of the metal and the conductivity requirement as well as the number of layers desired and the dimension of the cavity. Typical thickness ranges between 50 angstroms and 500 angstroms with 100 A to 200 A being the preferred thickness. The metal layers can be deposited with typical conformal thin film deposition techniques. For cavities with high aspect ratios, ALD can be the preferred technique. Conformality of +/−50% is desirable but the metal layers do not necessarily need to be free of thin spots.

Figure 5A:
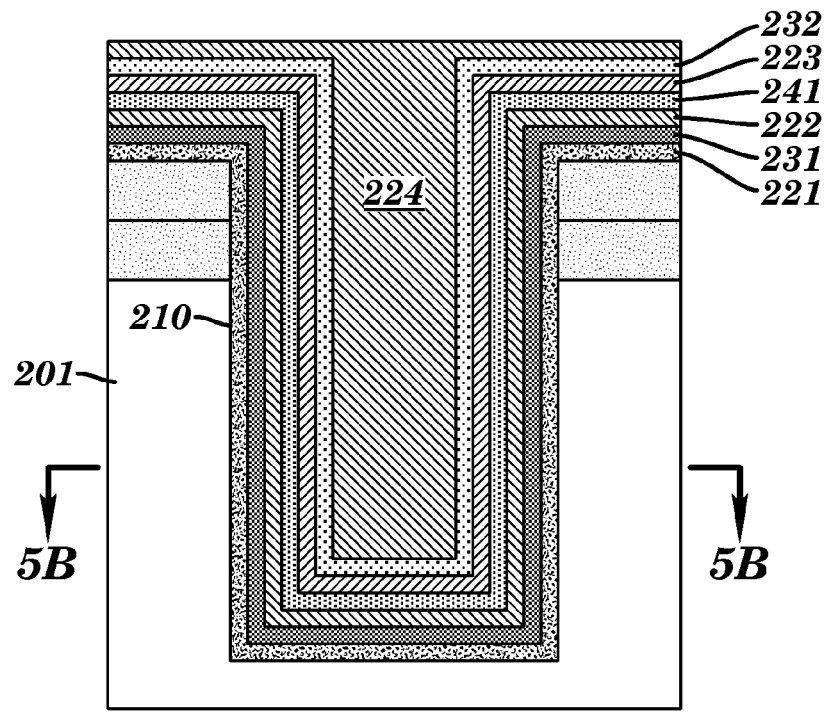
Figure 5B:
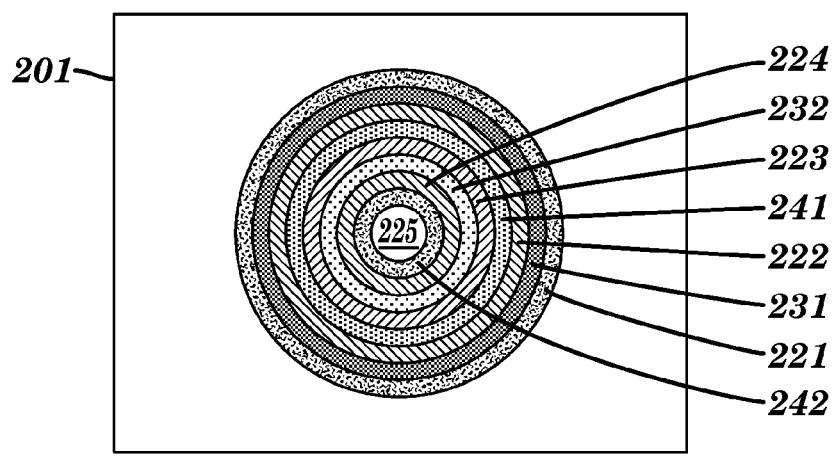

FIG. 5A illustrates just three metal layers (i.e., n=0), but the MIM capacitor according to the present invention can have many more metal layers. The simple MIM capacitor of FIG. 5A has two first-type metal layers 231 and 232, one second metal layer 241, and four dielectric layers 221, 222, 223, and 224. All dielectric layers of the present MIMCAP can be the same dielectric material, or some or each dielectric layer could comprise different dielectric materials. Similarly, all dielectric layers can be formed according to the same process, but the invention is not so limited. All first-type metal layers can be, but are not necessarily, the same material, so long as all of the first-type metal layers can be selectively etched relative to all the second-type metal layers. Similarly, all second-type metal layers can be, but are not necessarily, the same material, so long as all of the second-type metal layers can be selectively etched relative to all the first-type metal layers. FIG. 5B illustrates a cross section at cut '5B' of a pore embodiment having four metal layers, two being first-type metal layers 231 and 232 and two being second-type metal layers 241 and 242. Five dielectric layers 221, 222, 223, 224, and 225 isolate each metal layer from the next adjacent metal layer or from the substrate 201. The last dielectric layer 225 fills the cavity inner core.

As noted, the materials of the first-type and second-type metal layers are selected such that a first selective etch recesses just one set (ie, all the first-type or all the second-type metal layers) and a second selective etch recesses just the other set. Some selective etch rates are listed in Hussein, et al., Metal Wet Etch Process Development for Dual Metal Gate CMOS, Electrochemical and Solid-State Letters, 8 (12) G333-G336 (2005). As one example, the first-type metal layers could be formed of PVD TiN and the second-type metal layers could be formed of PVD TaSiN (Si-30%), and the first and second etches could be SC2 and HF. SC2 chemistry (DI:H2O2:HCl at a ratio of 10:1.1:1) at 60 C can etch TiN at 10 A/min while only etching TaSiN at 0.01 A/min, whereas HF chemistry (H2O:HF) at a ratio of 50:1 at 60 C only etches TiN at 1.32 A/min while etching TaSiN at 33.6 A/min. An alternative HF etch could be H2O:HF at a ratio of 10:1 at 25 C, which only etches TiN at 2.47 A/min while etching TaSiN at 50.3 A/min. The metal materials and etch chemistries can be selected according to design requirements. In preferred embodiments, all first-type metal layers (whether or not formed of the same metal composition) be selectively etched by a single etch step (a "first etch") that substantially does not etch the second-type metal layers, and all second-type metal layers (whether or not formed of the same metal composition) be selectively etched by a single etch step (a "second etch") that substantially does not etch the first-type metal layers.

Figure 6:
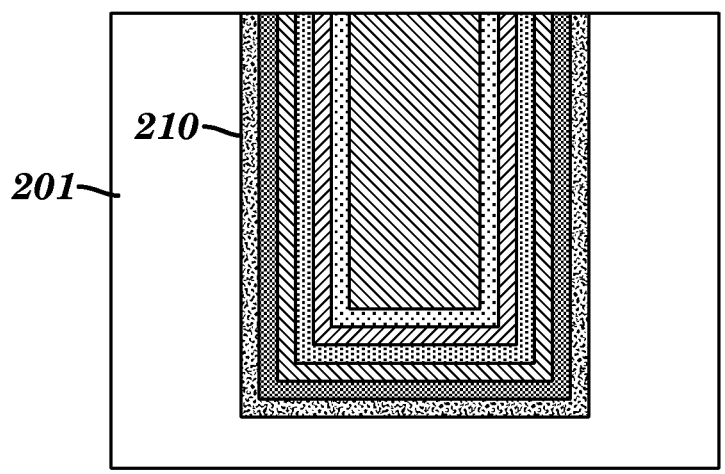

After depositing the complete sequence of layers, the structure can be planarized and polished as per FIG. 6. This step can be achieved using chemical mechanical polish (CMP). Each layer of the MIM stack can have a portion extending generally parallel to the sidewalls of cavity 210. Thus removing all overburden down to the substrate surface can expose a cross section of the stack, exposing an edge of every layer of the MIMCAP stack.

Figure 7A:
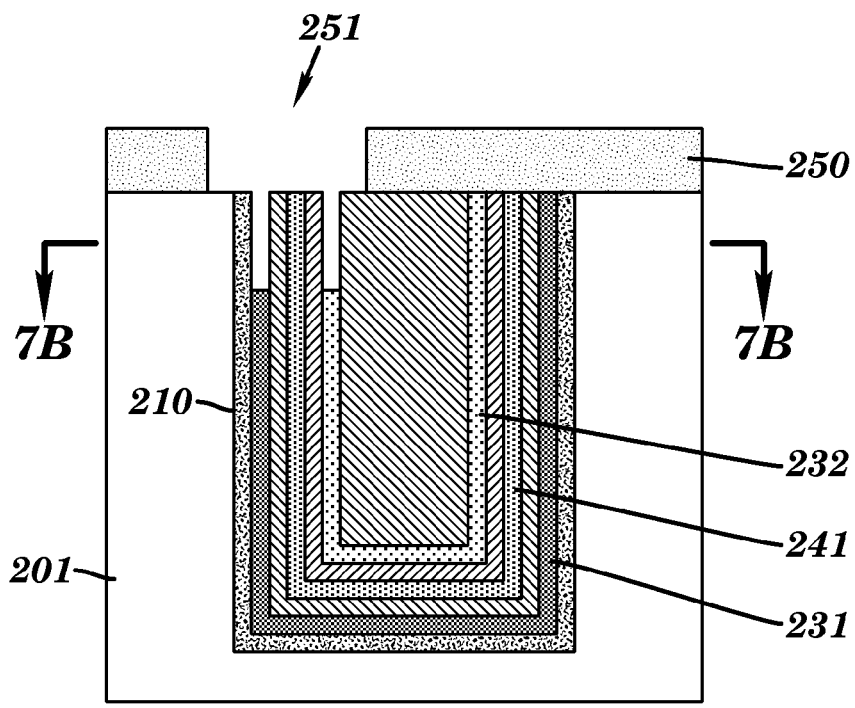
FIGS. 7A, 7B, 8A, and 8B illustrate selective etch of layers of a MIM stack in accordance with embodiments of the present invention.
Figure 7B:
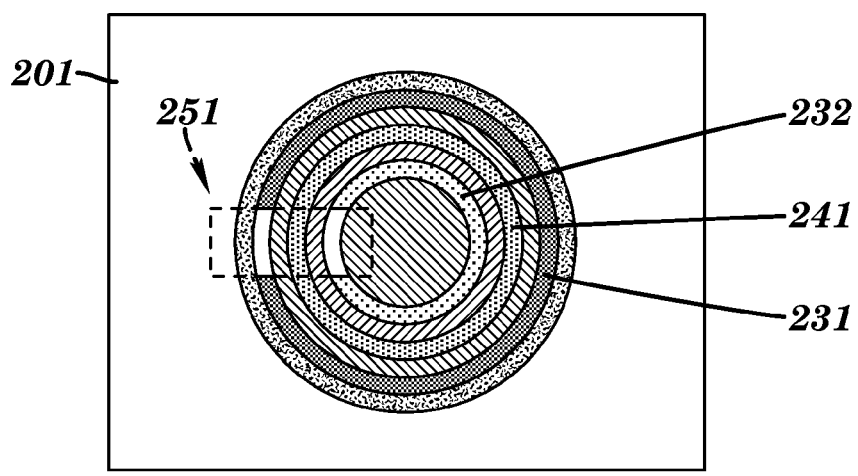

A mask layer 250 can be deposited and patterned to expose a first electrode region 251 of the planarized surface, which region can extend from the cavity sidewall to the last (innermost) dielectric layer. So long as the first electrode region extends in a first direction to expose an edge segment of each metal layer of the first type (or each metal layer of the second type), then a selective etch can recess all the first-type ($23x$) metal layers (or all the second-type metal layers), without significantly effecting the other set. FIG. 7A illustrates a first selective etch to recess the edge of first-type metal layers $23x$ exposed within region 251. A cross section of the structure of a pore embodiment of FIG. 7A at cut '7B' is shown in FIG. 7B.

After removing first mask 250, which can be by a conventional resist strip process, a second mask 260 can be deposited and patterned to expose a second electrode region 262 of the planarized surface Like the first electrode region, the second electrode rejoin can encompass the full set of second-type metal layers and can be patterned by a single mask. So long as it extends to expose an edge segment of each layer of the heretofore not-etched metal layer set, e.g., the second electrode region can extend from the cavity sidewall to the last (innermost) dielectric layer, then a second selective etch can recess those metal layers 24x not etched by the first selective etch. As shown in FIG. 8B, the second electrode region can be opposite the first electrode region, but this relative position is not required. The second electrode region can be located per convenience of the process integration. It can, e.g., be adjacent the first electrode region. In preferred embodiments there is no overlap of the first and second electrode regions.

Figure 8A:
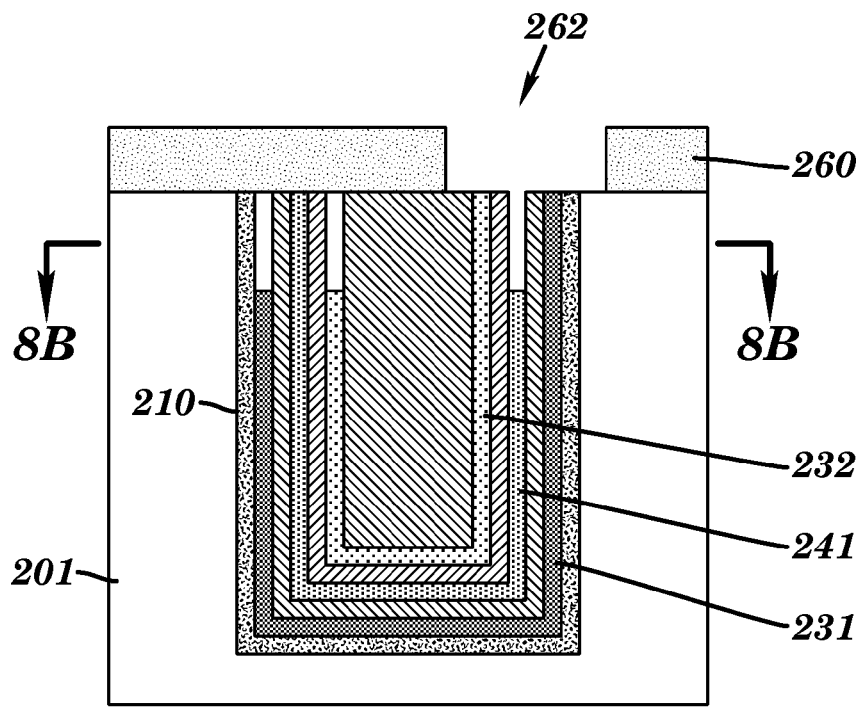
Figure 8B:
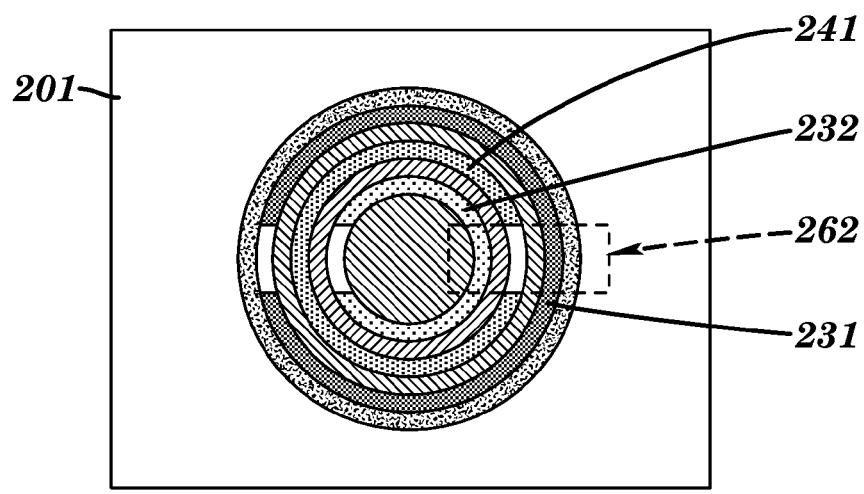

FIG. 8A shows second metal layer 241 recessed by the second selective etch, and a cross section of the structure of a pore embodiment of FIG. 8A at cut '8B' is shown in FIG. 8B. Note that if the MIM stack had more layers, for example, with three second metal layers, then all three could be exposed by a single 'second electrode mask', and all three could be recessed simultaneously by a single 'second selective etch' step. In some embodiments, the substrate can constitute a plate of the MIMCAP. If the substrate constituted part of the 'second-type' plate of the ultimate capacitor structure, one option would be to recess the substrate within the second electrode region, but another option would be to pattern the second electrode (as described in conjunction with FIGS. 10A and 10B) such that it did not extend over the substrate.

Figure 9A:
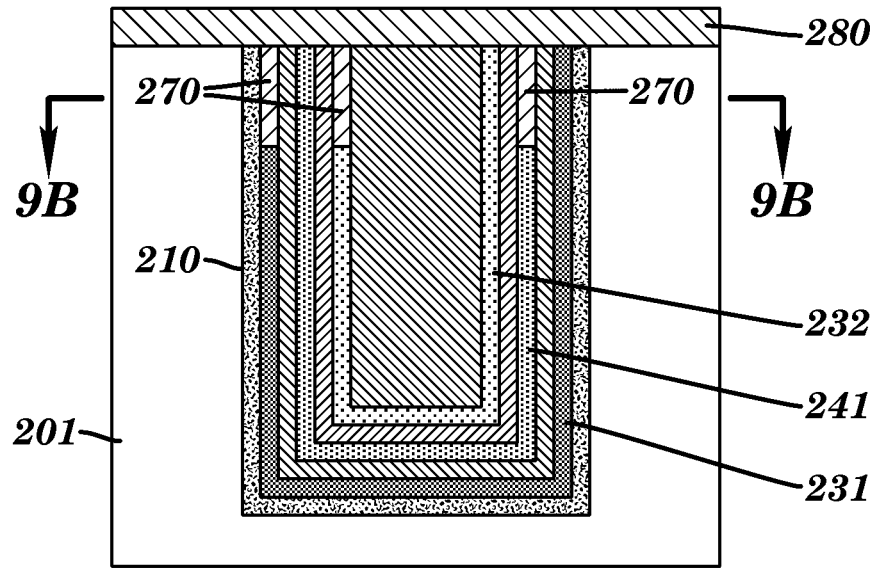
FIGS. 9A, 9B, 10A, and 10B illustrate forming electrodes in a MIM capacitor in accordance with embodiments of the present invention.
Figure 9B:
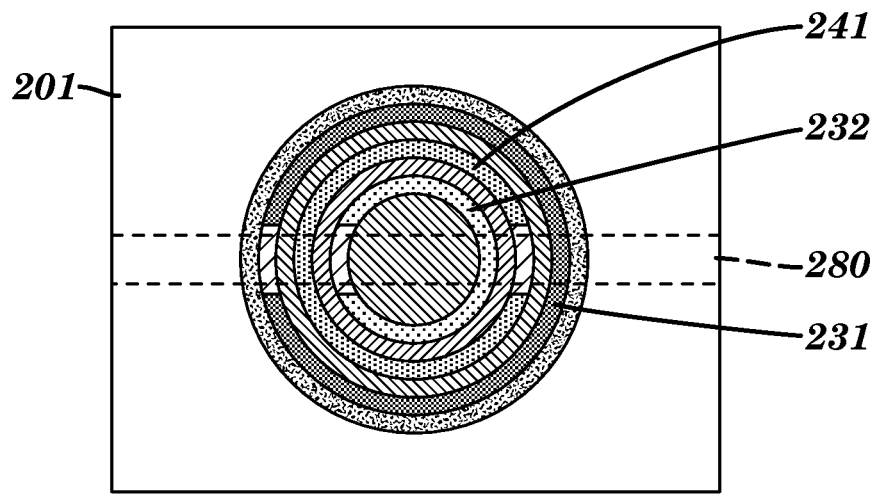
Figure 10A:
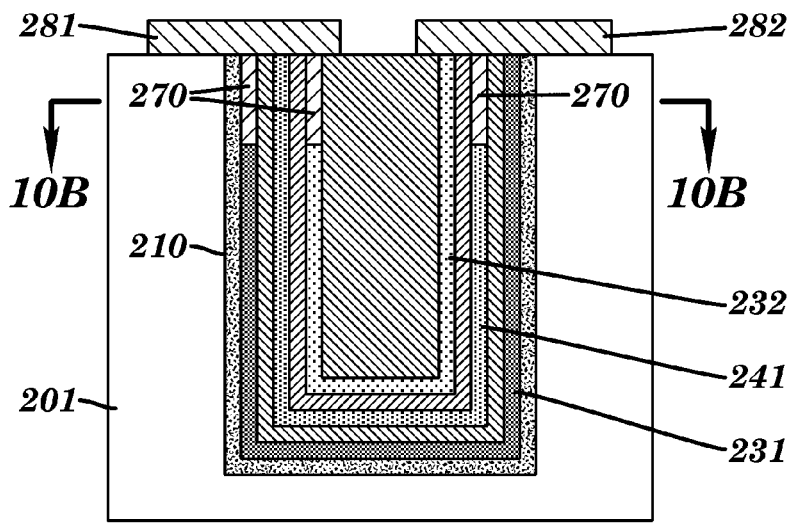
Figure 10B:
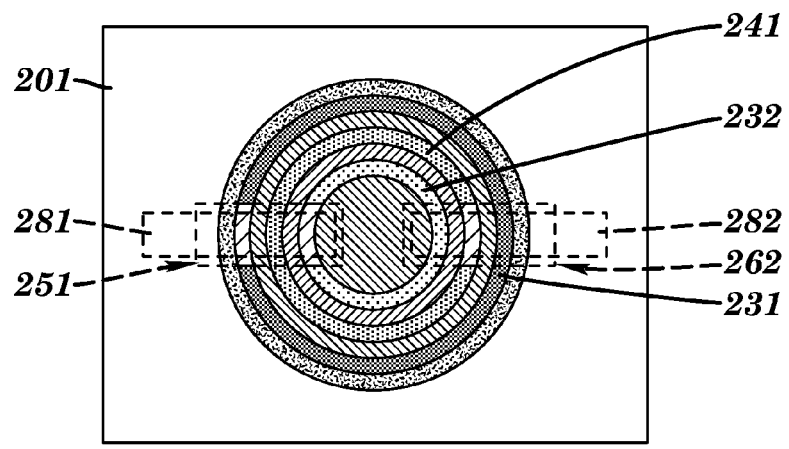

As illustrated in FIG. 9A, a dielectric material 270 can backfill the recesses formed by the two selective etch steps. Appropriate dielectric materials include oxide, nitride, or amorphous carbon. After removing excess dielectric 270, such as by CMP, the MIMCAP electrodes can be formed. According to one embodiment, a conductive film 280 can be formed over the wafer, such film in conductive contact with the exposed metal layers of the MIMCAP and extending over the substrate surface. FIG. 9B illustrates that conductive film 280 can extend over dielectric regions 270 to avoid conductive contact with corresponding metal layers. A patterning step can form a first electrode 281 that is in contact with all second-type metal layers 24x (and no first-type metal layers) and a second electrode 282 that is in contact with all first-type metal layers 23x (and no second-type metal layers) as illustrated in FIG. 10A and FIG. 10B. For example, continuing with the embodiment illustrated by FIGS. 7 and 8, the first electrode 281 can contact the MIMCAP stack only within the first exposed region 251 so that electrode 281 connects all second metal layers but is insulated from all first metal layers by the dielectric that backfilled the recesses formed by the first selective etch. And the second electrode 282 can contact the MIMCAP stack only within the second exposed region, whereby electrode 282 connects all first-type metal layers but is insulated from all second-type metal layers by the dielectric backfill in the recesses formed by the second selective etch. If the substrate constituted a plate of this MIMCAP, then electrode 281 could be formed to connect all second-type metal layers with the substrate plate, and electrode 282 could be trimmed such that it contacts all first-type metal layers and does not contact the substrate plate.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method to form a deep-trench capacitor comprising:
   providing substrate having a stack of metal layers in a cavity, said stack comprising first-type metal layers and second-type metal layers, wherein each adjacent pair of said stack comprises one first-type metal layer and one second-type metal layer, said stack further comprising an insulating layer between said adjacent pairs;
   exposing a cross section of said stack;
   etching said first-type metal layers within a first area of said cross section while not appreciably etching said second-type metal layers;
   etching said second-type metal layers within a second area of said cross section while not appreciably etching said first-type metal layers.

2. The method of claim 1 wherein said etching said first-type metal layers creates a first recess and said etching said second-type metal layers creates a second recess, the method further comprising:
   filling said first recess and said second recess with dielectric.

3. The method of claim 2 further comprising
   connecting said first-type metal layers to said second-type metal layers by forming a conductive structure in contact with second-type metal layers within said first area and in contact with first-type metal layers within said second area.

4. The method of claim 2 further comprising:
   covering said cross section with a conductive layer, etching said conductive layer to form a first electrode fully within said first area and a second electrode fully within said second area.

5. The method of claim 3 further comprising:
   etching said conductive structure to form a first electrode fully within said first area and a second electrode fully within said second area.

6. The method of claim 5 wherein said etching said conductive structure is by reactive ion etch.

7. The method of claim 1, wherein either of said etching steps comprises applying an etchant of hydrofluoric acid.

8. The method of claim 1, wherein either of said etching steps comprises applying an etchant of hydrochloric acid.

9. The method of claim 1, further comprising:
   depositing at least one metal layer of said stack in said cavity by atomic layer deposition.

10. The method of claim 1, further comprising:
    depositing at least one of said insulating layer by PECVD or by atomic layer deposition.

11. The method of claim 1, further comprising:
    forming an insulating layer between said stack and said cavity by thermal processing.

* * * * *